(12) United States Patent
Kim et al.

(10) Patent No.: US 10,091,872 B2
(45) Date of Patent: Oct. 2, 2018

(54) TOUCH WINDOW AND DISPLAY INCLUDING THE SAME

(71) Applicant: LG INNOTEK CO., LTD., Seoul (KR)

(72) Inventors: Jong Sun Kim, Seoul (KR); Chan Kyu Koo, Seoul (KR); Tae Kyung Kim, Seoul (KR); Ji Hyouk Chung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 132 days.

(21) Appl. No.: 14/332,097

(22) Filed: Jul. 15, 2014

(65) Prior Publication Data
US 2015/0022736 A1    Jan. 22, 2015

(30) Foreign Application Priority Data

Jul. 16, 2013 (KR) .................. 10-2013-0083660

(51) Int. Cl.
*H05K 1/02* (2006.01)
*G02F 1/1343* (2006.01)
(Continued)

(52) U.S. Cl.
CPC ........... *H05K 1/0296* (2013.01); *G06F 3/044* (2013.01); *H05K 1/0274* (2013.01); *G06F 2203/04102* (2013.01)

(58) Field of Classification Search
CPC ............ G06F 3/041; G06F 3/044; G06F 1/16; H05K 1/02; H05K 1/0296; H05K 1/0274; G02F 1/1343
See application file for complete search history.

(56) References Cited

U.S. PATENT DOCUMENTS

2010/0308408 A1    12/2010  Song et al.
2010/0328328 A1*   12/2010  Choi ................... B06B 1/0688
                                                     345/530
(Continued)

FOREIGN PATENT DOCUMENTS

KR    10-2012-0014302 A    2/2012
KR    10-2013-0027747 A    3/2013
(Continued)

OTHER PUBLICATIONS

European Search Report in International Application No. 14177168.3.

*Primary Examiner* — Temesghen Ghebretinsae
*Assistant Examiner* — Paras D Karki
(74) *Attorney, Agent, or Firm* — Saliwanchik, Lloyd & Eisenschenk

(57) ABSTRACT

Disclosed are a touch window and a display including the same. The touch window includes a substrate, and a sensing electrode provided on the substrate to detect a position. The sensing electrode includes first electrode parts extending in a first direction, second electrode parts extending in a second direction crossing the first direction, and third electrode parts interposed between the first and second electrode parts while extending in a third direction crossing the first and second directions. The touch window includes a substrate, and an electrode part provided on the substrate to detect a position. The electrode part includes a first sub-pattern, an electrode layer on the first sub-pattern, and a second sub-pattern adjacent to the first sub-pattern. A length of the second sub-pattern is at least equal to longer than a length of one of first sub-patterns.

8 Claims, 15 Drawing Sheets

(51) Int. Cl.
*G06F 3/041* (2006.01)
*G06F 3/044* (2006.01)

(56) References Cited

U.S. PATENT DOCUMENTS

| | | | |
|---|---|---|---|
| 2011/0007011 A1* | 1/2011 | Mozdzyn | G06F 3/044 345/173 |
| 2011/0157065 A1 | 6/2011 | Murata et al. | |
| 2011/0310037 A1 | 12/2011 | Moran et al. | |
| 2012/0187821 A1 | 7/2012 | Lee et al. | |
| 2012/0313880 A1 | 12/2012 | Geaghan et al. | |
| 2012/0327021 A1* | 12/2012 | Ryu | G06F 3/044 345/174 |
| 2013/0063371 A1 | 3/2013 | Lee et al. | |
| 2013/0234974 A1* | 9/2013 | Guard | G06F 3/044 345/174 |
| 2013/0241857 A1* | 9/2013 | Chung | G06F 3/041 345/173 |
| 2013/0335375 A1* | 12/2013 | Nishikawa | G06F 3/044 345/174 |
| 2014/0118641 A1* | 5/2014 | Ryu | G06F 1/1692 349/12 |
| 2014/0134328 A1 | 5/2014 | Choi et al. | |
| 2014/0168590 A1* | 6/2014 | Chen | G02F 1/13439 349/138 |
| 2014/0299361 A1 | 10/2014 | Hiroshige et al. | |
| 2015/0009420 A1* | 1/2015 | Zhou | H05K 3/107 349/12 |

FOREIGN PATENT DOCUMENTS

| | | |
|---|---|---|
| KR | 10-2013-0033538 A | 4/2013 |
| KR | 10-2013-0011901 A | 8/2013 |
| TW | 2013-27316 A | 7/2013 |
| WO | WO-2010-099132 A2 | 9/2010 |
| WO | WO-2010-141708 A1 | 12/2010 |

* cited by examiner

TOUCH WINDOW AND DISPLAY INCLUDING THE SAME

CROSS-REFERENCES TO RELATED APPLICATION

This application claims the benefit under 35 U.S.C. § 119 of Korean Patent Application No. 10-2013-0083660, filed Jul. 16, 2013, which is hereby incorporated by reference in its entirety.

BACKGROUND

Technical Field

The embodiment relates to a touch window and a display including the same.

Recently, a touch panel, which performs an input function through the touch of an image displayed on a display by an input device such as a stylus pen or a hand, has been applied to various electronic appliances.

The touch panel may be mainly classified into a resistive touch panel and a capacitive touch panel. In the resistive touch panel, the position of the touch point is detected by detecting the variation of resistance according to the connection between electrodes when pressure is applied to an input device. In the capacitive touch panel, the position of the touch point is detected by detecting the variation in capacitance when a finger of the user is touched on the capacitive touch panel between electrodes. When taking into consideration the convenience of a fabrication scheme and a sensing power, the capacitive touch panel has been spotlighted in a smaller model touch panel recently.

Indium tin oxide (ITO), which has been most extensively used for a transparent electrode of the touch panel, has high cost, and is easily subject to physical damage due to the bending or the warping of a substrate, so that the characteristic of the ITO for the electrode is deteriorated. Accordingly, the ITO is not suitable for a flexible device. Further, when the ITO is applied to a large touch panel, a problem may be caused by high resistance.

In order to solve the problem, the studies and researches on alternative electrodes have been actively performed. In particular, although the substitute for ITO is formed by making the shape of the mesh using metallic materials, a non-etching phenomenon of an electrode material may occur. In other words, when the electrode material is etched, the electrode material may remain in a non-meshed part due to the non-etching phenomenon. Accordingly, the reliability of an electrode may be degraded, and the electrode material may be viewed.

BRIEF SUMMARY

The invention provides a touch window having improved reliability and a display including the same.

In order to accomplish the above object, according to an aspect of the present invention, there is provided a touch window including a substrate, and a sensing electrode provided on the substrate to detect a position. The sensing electrode includes first electrode parts extending in a first direction, second electrode parts extending in a second direction crossing the first direction, and third electrode parts interposed between the first and second electrode parts while extending in a third direction crossing the first and second directions.

According to another aspect, there is provided a touch window including a substrate, and an electrode part provided on the substrate to detect a position. The electrode part includes a first sub-pattern, an electrode layer on the first sub-pattern, and a second sub-pattern adjacent to the first sub-pattern. A length of the second sub-pattern is at least equal to longer than a length of one of first sub-patterns.

As described above, according to an embodiment, in the etching process after the electrode layer has been formed, a non-etching phenomenon is prevented in the electrode layer formed on the second sub-pattern, so that an etching characteristic can be improved. Accordingly, the entire portion of the electrode layer formed on the second sub-pattern is etched, so that the electrode layer may be provided only on the first sub-pattern. Therefore, the reliability of the electrode can be improved. In addition, the electrode layer can be prevented from being viewed by a non-etched part.

DETAILED DESCRIPTION

Figure 1:
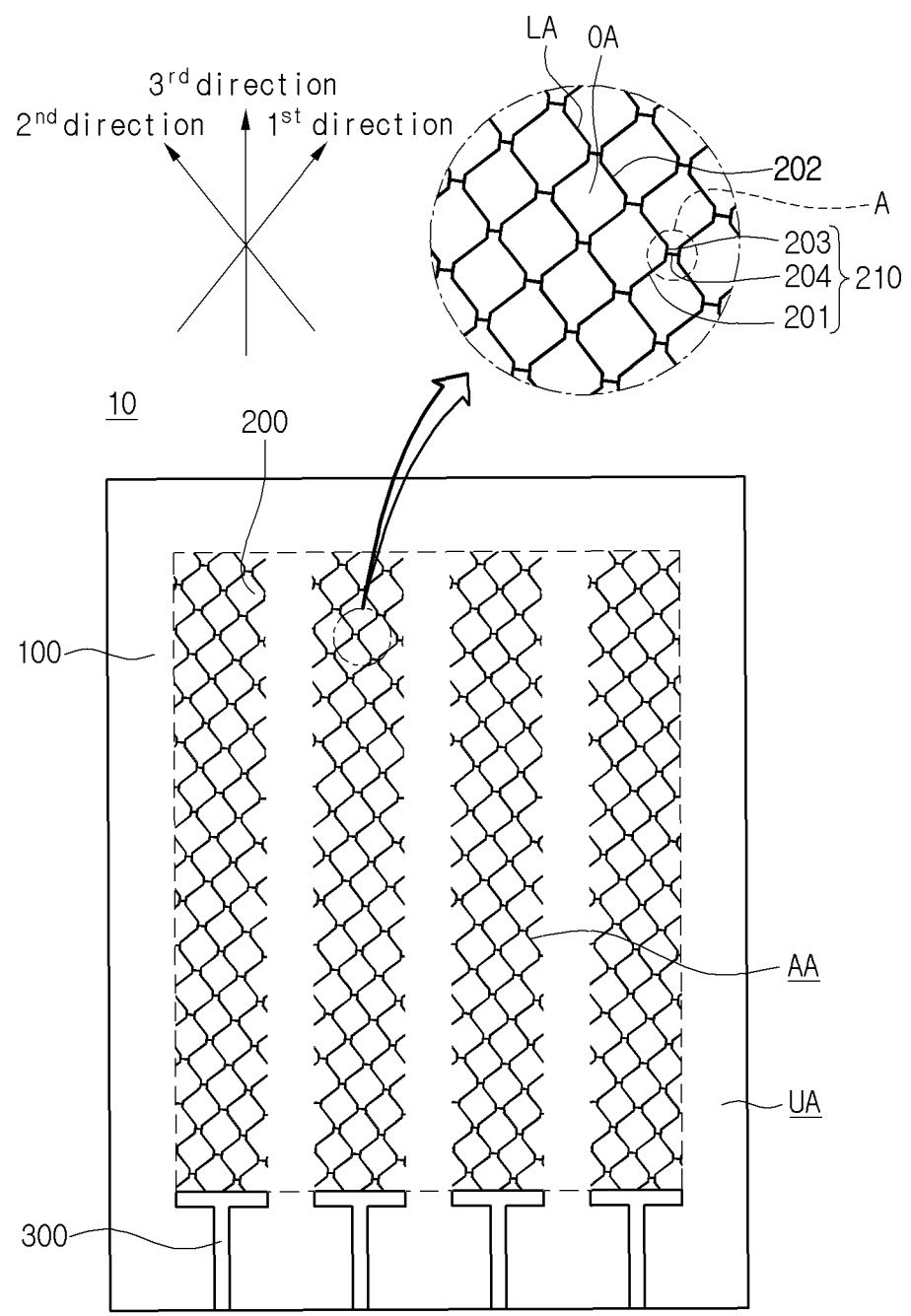
FIG. 1 is a plan view showing a touch window according to an embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiment will be described with reference to accompanying drawings.

Hereinafter, a touch window according to the embodiment will be described in detail with reference to FIGS. 1 to 3.

FIG. 1 is a plan view showing a touch window according to the embodiment. FIG. 2 is an enlarged view showing a part A of FIG. 1. FIG. 3 is a sectional view taken along line B-B' of FIG. 2.

Referring to FIG. 1, a touch window 10 according to the embodiment includes a substrate 100 having an active area AA, in which a position of an input device (e.g., finger) is detected, and an inactive area UA provided at a peripheral portion of the active area AA.

In this case, the active area AA may be provided therein with electrode parts 200 that may sense the input device. In addition, the inactive area UA may be provided therein with wires 300 electrically connecting the electrode parts 200 to each other. Further, the inactive area UA may be provided therein with an external circuit connected to the wires 300.

If the input device such as the finger touches the touch window, the variation of capacitance occurs in the touched part by the input device, and the touched part subject to the variation of the capacitance may be detected as a touch point.

Hereinafter, the touch window will be described in more detail.

The substrate 100 may include various materials to support the electrode parts 200, the wires 300, and a circuit board formed on the substrate 100. For instance, the substrate 100 may include a glass substrate or a plastic substrate.

The outer dummy layer is formed in the inactive area UA of the substrate 100. The outer dummy layer may be coated with a material having a predetermined color so that the wires 300 and a printed circuit board connecting the wires 300 to external circuits cannot be viewed from the outside. The outer dummy layer may have a color suitable for a desired outer appearance thereof. For example, the outer dummy layer includes black pigments to represent black. In addition, a desired logo may be formed in the outer dummy layer through various schemes. The outer dummy layer may be formed through deposition, print, and wet coating schemes.

The electrode part 200 may be formed on the substrate 100. The electrode part 200 may detect whether the input device such as the finger is touched or not. FIG. 1 shows the electrode part 200 extending in one direction on the substrate 100, but the embodiment is not limited thereto. Accordingly, the electrode part 200 may extend in a direction crossing the one direction. In addition, the electrode part 200 may two types of electrode parts having a shape extending in one direction and a shape extending in another direction.

In addition, FIG. 1 shows the electrode part 200 having a bar shape, but the embodiment is not limited thereto. Therefore, the electrode part 200 may have various shapes such as polygonal shapes including a rhombus shape, a triangular shape, and a rectangular shape, a circular shape, or an oval shape.

The electrode part 200 is arranged in the shape of a mesh. In detail, the electrode part 200 includes a mesh opening OA and a mesh line LA. In this case, a line width of the mesh line LA may be in the range of 0.1 μm to 10 μm. A mesh line LA having a line width of 0.1 μm or less may not be formed due to the characteristic of the fabricating process. If the line width is 10 μm or less, the pattern of the electrode part 200 may not be viewed. Preferably, the line width of the mesh line LA may be in the range of 1 μm to 5 μm.

As the electrode part 200 has the shape of the mesh, the pattern of the electrode part 200 may not be viewed in the active area AA. In other words, even if the electrode part 200 that is transparent includes metal, the pattern may not be viewed. In addition, even if the electrode part 200 is applied to a large-size touch window, the resistance of the touch window may be reduced.

In this case, the electrode part 200 includes a sensing electrode 210 substantially serving as an electrode. Referring to FIGS. 1 and 2, the sensing electrode 210 includes first electrode parts 201 extending in a first direction, second electrode parts 202 extending in a second direction, and third electrode parts 203 extending in a third direction.

The first electrode parts 201 may extend in the first direction.

The second electrode parts 202 may extend in the second direction crossing the first direction. In other words, the second electrode parts 202 are arranged in a direction crossing the extending direction of the first electrode parts 201.

The third electrode part 203 may be interposed between the first and second electrode parts 201 and 202. The third electrode part 203 may extend from the first and second electrode parts 201 and 202. The third electrode part 203 may extend in the third direction. The third direction may cross the first and second directions. In other words, the third electrode part 203 is arranged in a direction crossing the extending direction of the first and second electrode parts 201 and 202.

Meanwhile, the sensing electrode 210 may further include the fourth electrode parts 204. The fourth electrode parts 204 may extend in a direction crossing the first, second, and third directions. The fourth electrode parts 204 may be interposed between adjacent third electrode parts 203. The fourth electrode part 204 may connect the third electrode parts 203 to each other. Accordingly, both ends of the fourth electrode part 204 may make contact with the third electrode part 203.

Figure 2:
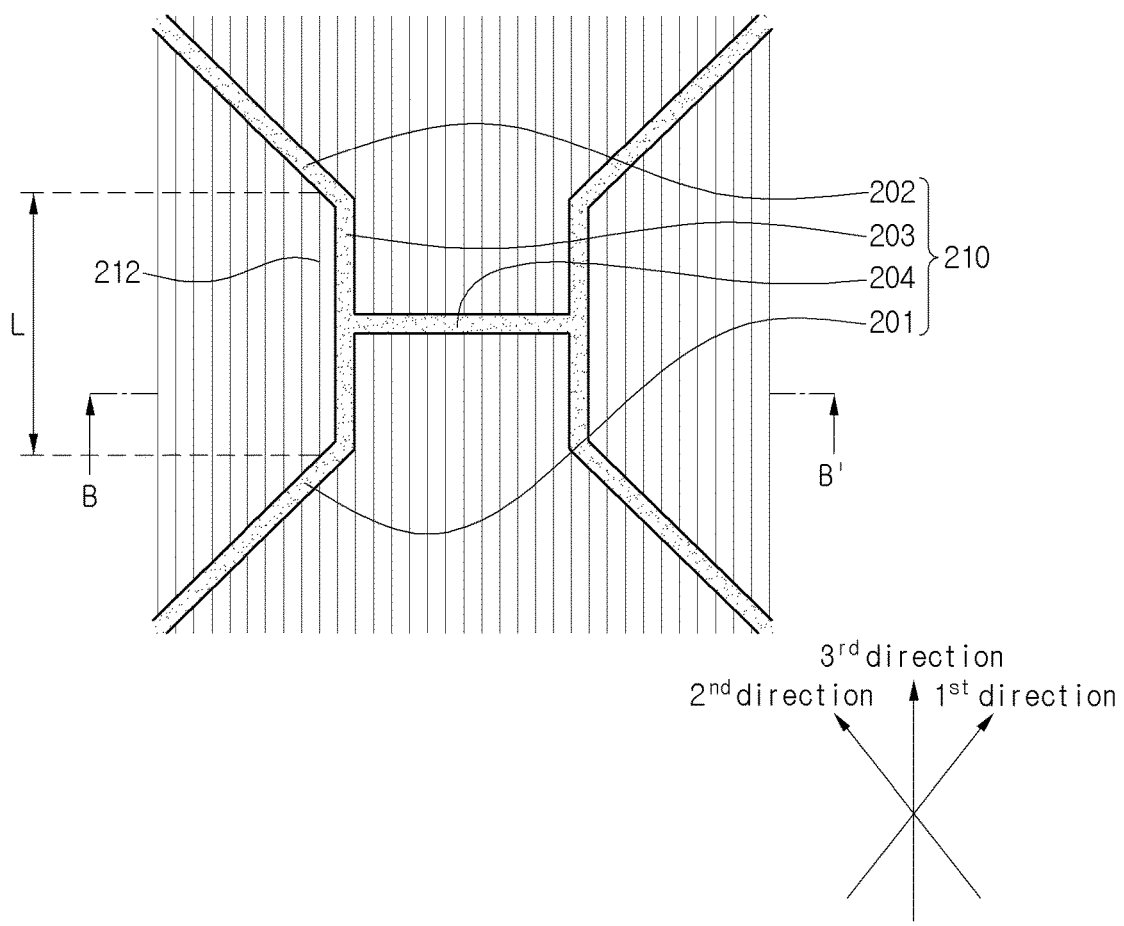
FIG. 2 is an enlarged view showing a part A of FIG. 1.

Referring to FIG. 2, the third and fourth electrode parts 203 and 204 may form an H shape.

In other words, differently from a conventional shape in which the first electrode part 201 crosses the second electrode part 202, the first and second electrode parts 201 and 202 do not cross each other, and the third and fourth electrode parts 203 and 204 are provided, thereby providing a new mesh structure.

Meanwhile, fifth electrode parts extending the first electrode parts 201, the second electrode parts 202, the third electrode parts 203, or the fourth electrode parts 204 may be additionally included.

Figure 3:
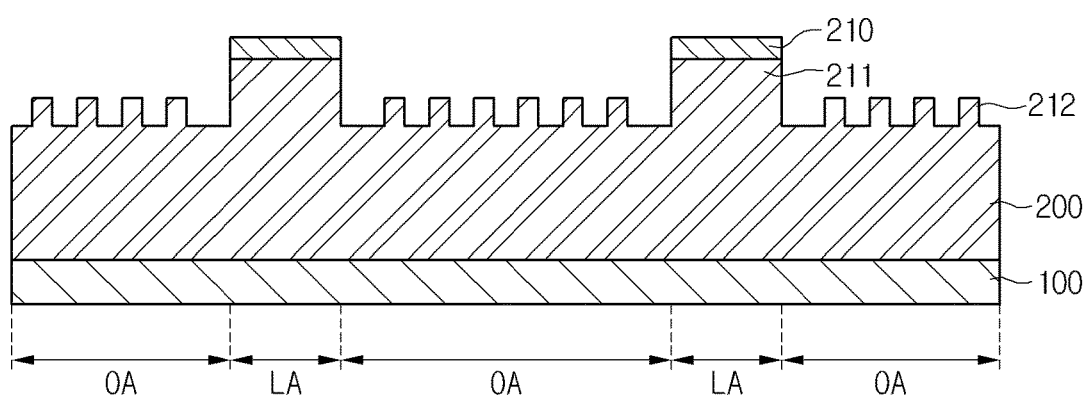
FIG. 3 is a sectional view taken along line B-B' of FIG. 2.

Thereafter, referring to FIGS. 2 and 3, the electrode part 200 may include a first sub-pattern 211, a second sub-pattern 212, and an electrode layer 210.

The first sub-pattern 211 is provided on the substrate 100. The first sub-pattern 211 is provided on a mesh line LA. Accordingly, the first sub-pattern 211 may be arranged in a mesh shape. The first sub-pattern 211 may be an embossed pattern.

The second sub-pattern is provided on the substrate 100. The second sub-pattern 212 is provided in a mesh opening OA. Accordingly, the second sub-pattern 212 may be provided between the first sub-patterns 211. The second sub-pattern 212 may be an embossed pattern.

The line width of the second sub-pattern 212 may be narrower than that of the first sub-pattern 211. In addition, the height of the second sub-pattern 212 is lower than that of the first sub-pattern 211.

The first and second sub-patterns 211 and 212 may include resin or polymer.

The electrode layer 210 is provided on the first sub-pattern 211. Accordingly, the electrode layer 210 is provided on a mesh line LA. The electrode layer 210 may be provided in a mesh shape. The electrode layer 210 may include various metals representing superior electric conductivity. For example, the electrode layer 210 may include Cu, Au, Ag, Al, Ti, and Ni, and the alloy thereof The electrode layer 210 may substantially serve as the sensing electrode. Since the electrode layer 210 is provided on the first sub-pattern 211, the electrode layer 210 and the first sub-pattern 211 may include the first to fourth electrode parts 201, 202, 203, and 204.

Meanwhile, referring to FIG. 2, the length L of the second sub-pattern 212 having both end portions making contact with the sensing electrodes 210 is at least equal to the length of the sensing electrode 210 adjacent to the second sub-pattern 212, or longer than that of the sensing electrode 210 adjacent to the second sub-pattern 212. In other words, the length L of the second sub-pattern 212 is at least equal to or longer than the length of any one of the first to fourth electrode parts 201 to 204. In other words, the length L of the second sub-pattern 212 may be at least equal to or longer than the length of any one of the first sub-patterns 211.

Accordingly, in the etching process after the electrode layer 210 has been formed, a non-etching phenomenon is prevented in the electrode layer 210 formed on the second sub-pattern 212, so that an etching characteristic can be improved. Accordingly, the entire portion of the electrode layer 210 formed on the second sub-pattern 212 is etched, so that the electrode layer 210 may be provided only on the first sub-pattern 211. Accordingly, the reliability of the electrode can be improved. In addition, the electrode layer 210 is prevented from being viewed by a non-etched part.

Thereafter, the wires 300 are provided in the inactive area UA. The wires 300 may apply an electrical signal to the electrode part 200. The wires 300 are formed on the inactive area UA, so that the wires 300 may not be viewed.

Meanwhile, although not shown in drawings, a circuit board connected to the wires 300 may be further located. The circuit board may include various circuit boards such as a flexible printed circuit board (FPCB).

Meanwhile, the touch window may be provided on a driving part. The driving part may include a display panel. The touch window is combined with the driving part to constitute a display.

The display panel has a display region to output an image. The display panel applied to the display may generally include upper and lower substrates. The lower substrate may include data lines, gate lines, and thin film transistors (TFT). The upper substrate is bonded to the lower substrate to protect components provided on the lower substrate.

The display panels may be provided in various types depending on the type of the display according to the present invention. In other words, the display according to the present invention may include a liquid crystal display (LCD), a field emission display, a plasma display (PDP), an organic light emitting diode (OLED), and an electrophoretic display (EPD). Accordingly, the display panel 20 may be configured in various types.

Figure 4:
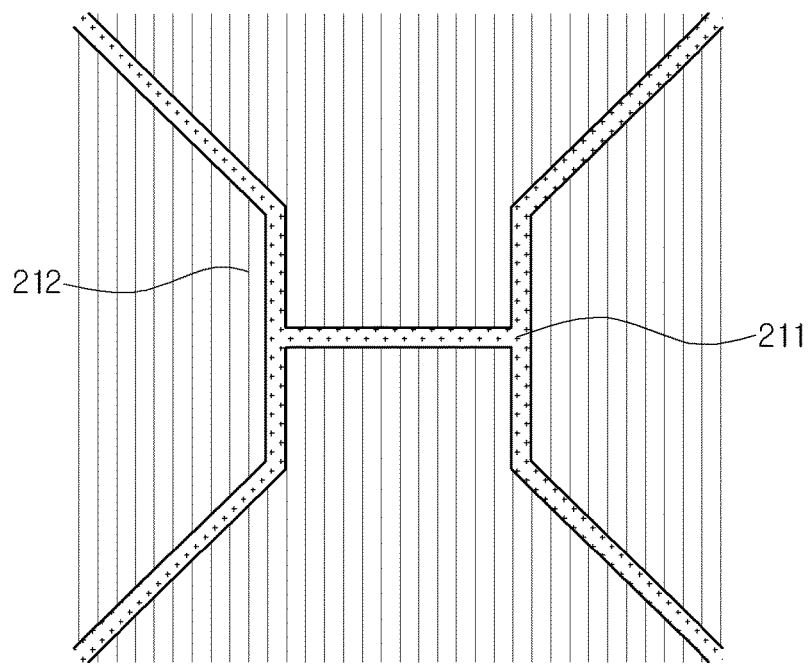
FIGS. 4 to 17 are enlarged views and sectional views to explain a method of fabricating the touch window according to certain embodiments.
Figure 4:
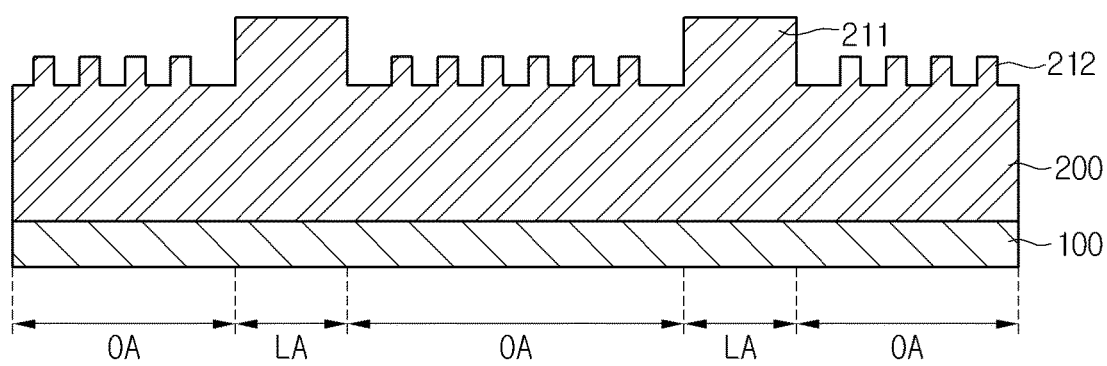
Figure 5:
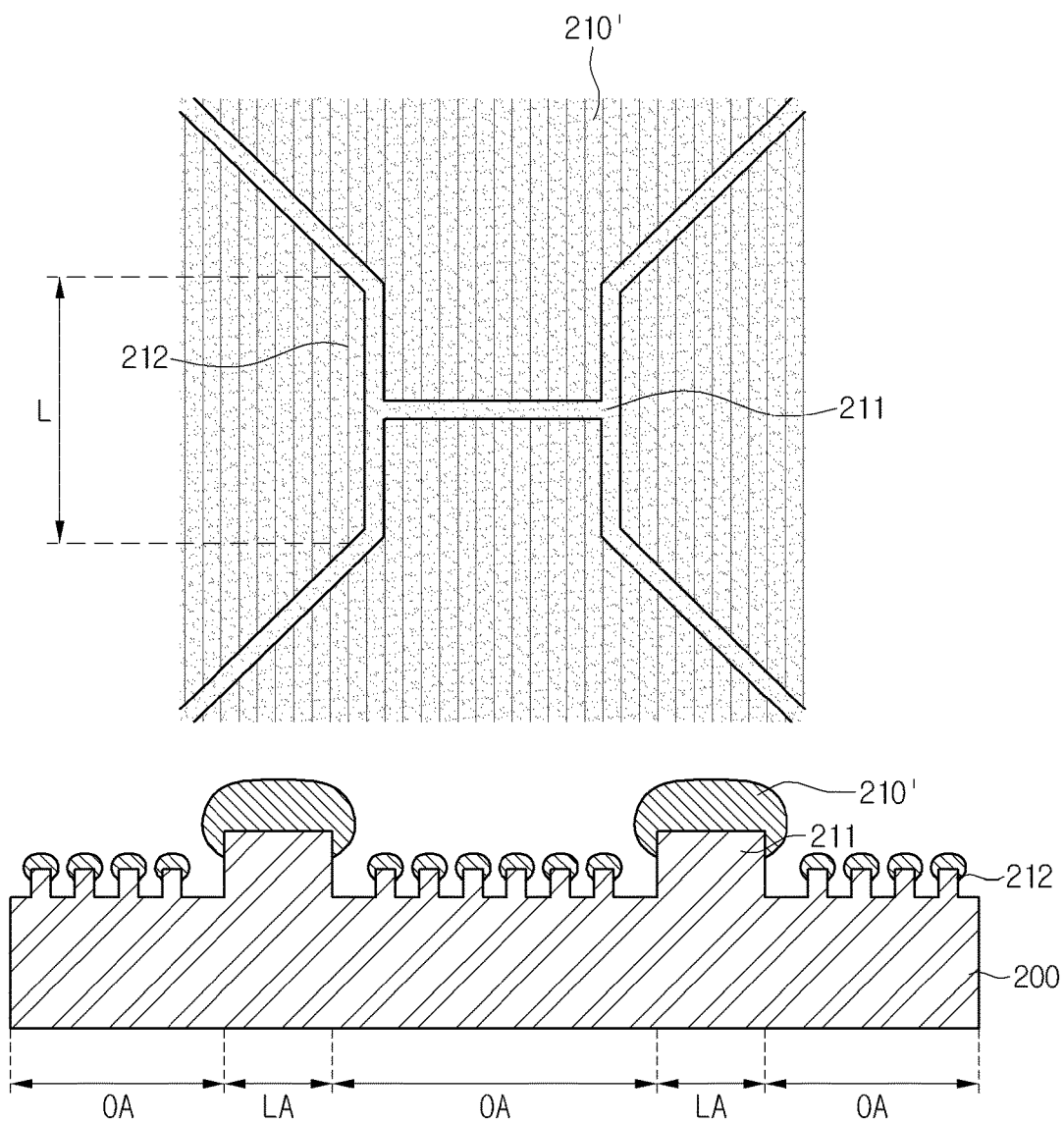
Figure 6:
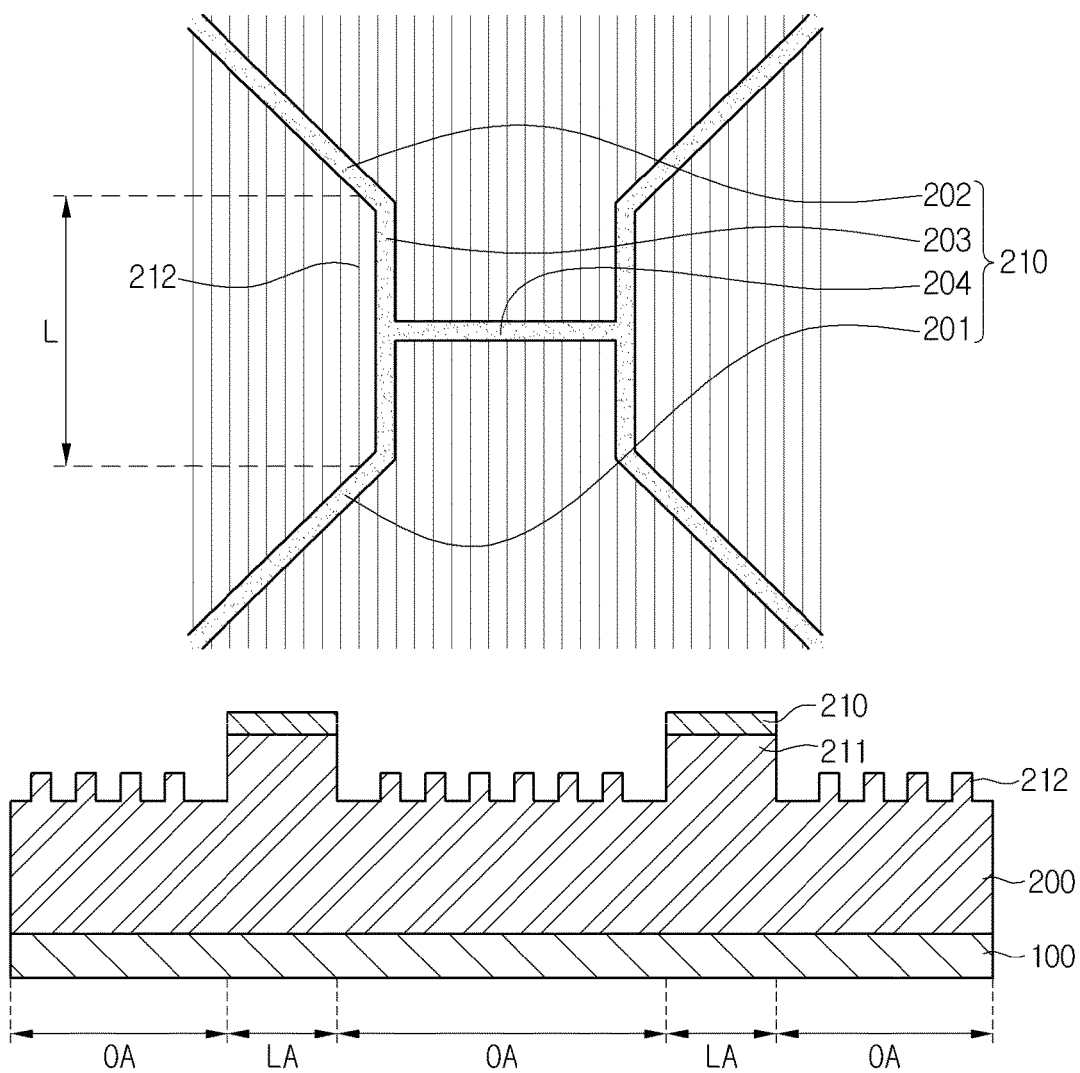

Hereinafter, a method of fabricating the touch window according to the embodiment will be described with reference to FIGS. 4 to 6. FIGS. 4 to 6 are enlarged views and sectional views to explain the method of fabricating the touch window according to the embodiment.

First, referring to FIG. 4, a mold having a pattern may be located on a resin and an imprinting process may be performed. The first and second sub-patterns 211 and 212 may be fabricated through the imprinting process.

Next, referring to FIG. 5, electrode materials 210' may be formed on the first and second sub-patterns 211 and 212. The electrode materials 210' may be formed through a deposition scheme or a plating scheme.

Thereafter, referring to FIGS. 5 and 6, the electrode materials 210' may be etched. In this case, a difference is made among etching areas depending on the difference among structures of the first and second sub-patterns 211 and 212 and the difference among bonding areas with the electrode materials 210'. In other words, since the bonding area between the first sub-pattern 211 and the electrode material 210' is wider than the bonding area between the second sub-pattern 212 and the electrode material 210', the electrode material 210' formed on the first sub-pattern 211 may be less etched. In addition, as the etching process is performed at the same etch rate, the electrode materials 210' formed on the first sub-pattern 211 remains, and the electrode material 210' formed on the second sub-pattern 212 is etched and removed. In particular, as described above, the entire portion of the electrode materials 210' formed on the second sub-pattern 212 is etched due to the characteristics in the shape of the first sub-pattern 211 and the length of the second sub-pattern 212, so that a non-etched part can be omitted.

Figure 7:
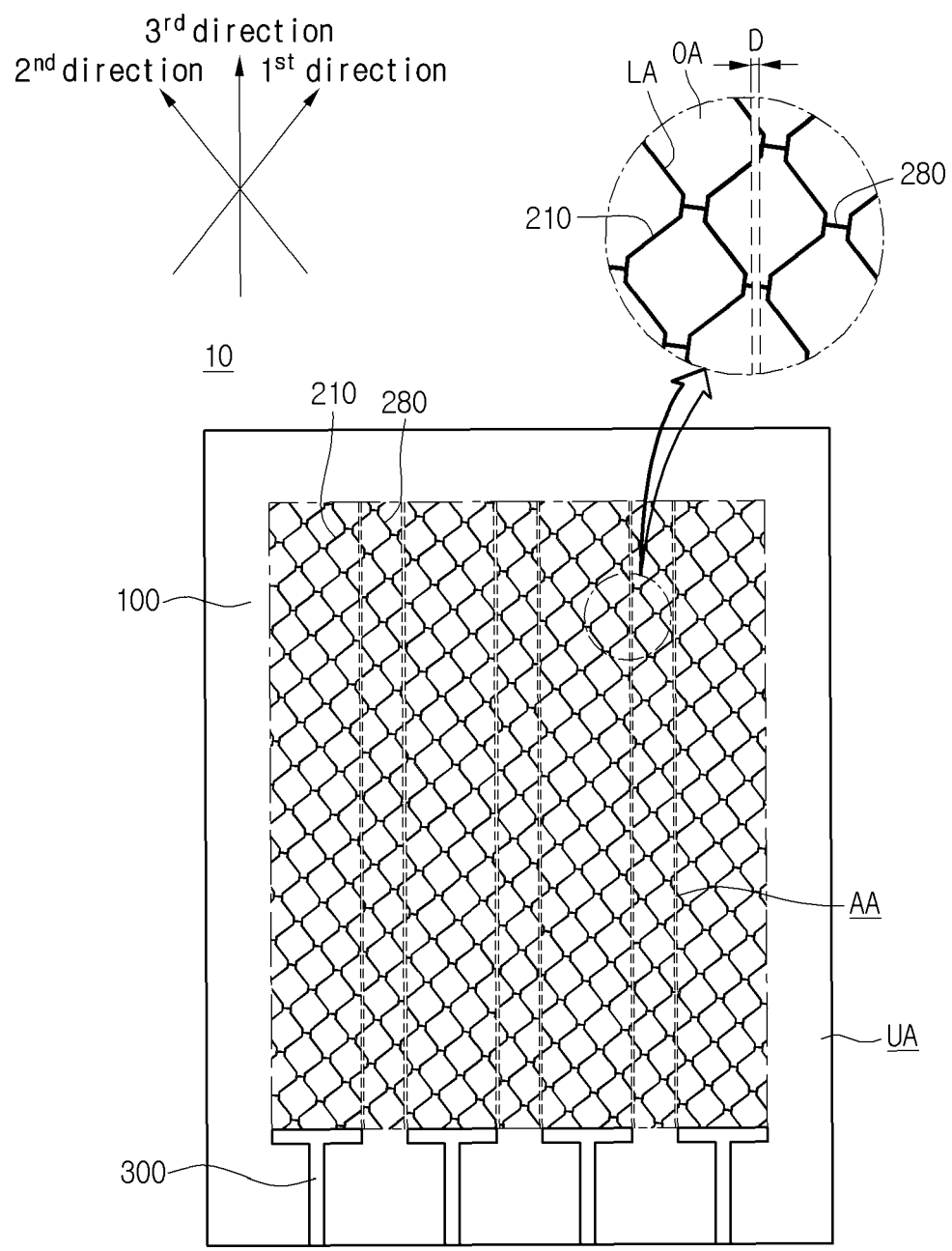
Figure 8:
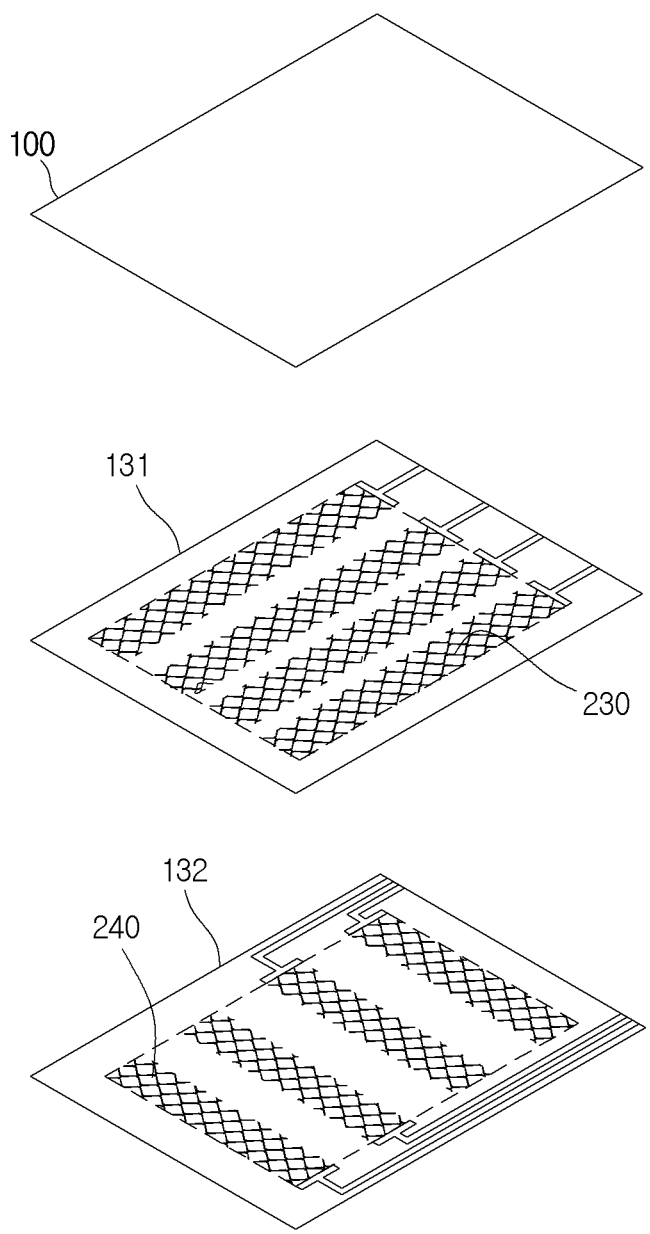

Meanwhile, referring to FIG. 7, in a touch window according to another embodiment, the sensing electrode 210 may be provided on the substrate 100 to sense a touch position, and a dummy part 280 my be provided adjacent to the sensing electrode 210. The dummy part 280 may be located among the sensing electrodes 210. The dummy part 280 may have a pattern the same as or similar to that of the sensing electrode 210. In other words, the dummy part 280 may include an H-shaped mesh pattern described above. The optical characteristic and the visibility of the touch window can be improved through the dummy part 280. In particular, the distance D between the sensing electrode 210 and the dummy part 280 may be in the range of 1 μm to 500 μm. Accordingly, when the sensing electrode 210 is provided in a screen image region of the display, the conductive patterns of the sensing electrode 210 can be prevented from opaquely viewed or blurrily viewed.

Figure 9:
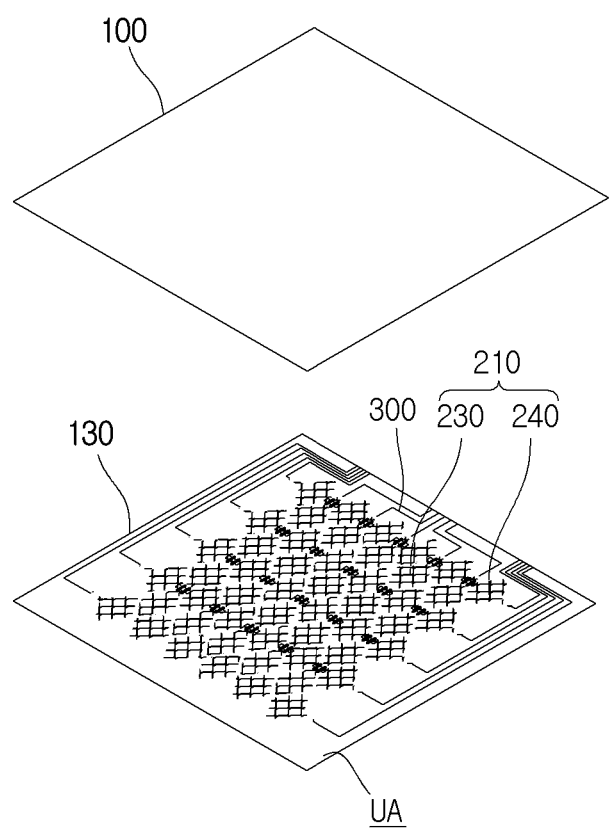

Thereafter, referring to FIG. 9, the sensing electrode 210 may includes the first and second sensing electrodes 230 and 240.

In this case, the first sensing electrode 230 may be provided on a first substrate 131. The first sensing electrode 230 may extend in one direction.

The second sensing electrode 240 may be provided on a second substrate 132 spaced apart from the first substrate 131. The second sensing electrode 240 may extend in another direction crossing in one direction.

The cover substrate 100 may be additionally provided on the first and second substrates 131 and 132. In addition, an optical clear adhesive may be additionally provided among the cover substrate 100, the first substrate 131, and the second substrate 132.

In addition, although not shown in drawings, as shown in FIG. 7, a dummy part may be further provided between the first sensing electrodes 230 or between the second sensing electrodes 240.

Figure 10:
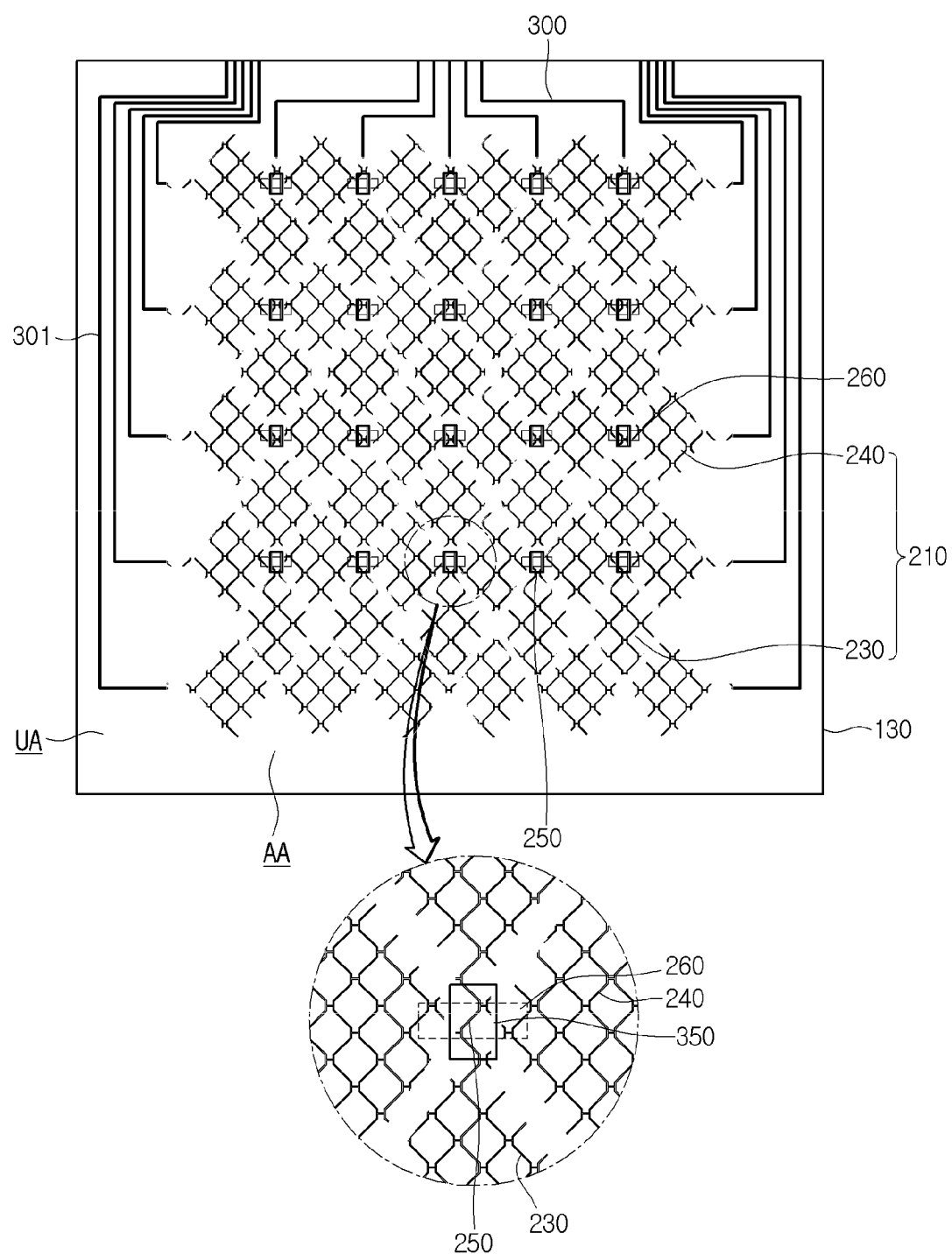

Meanwhile, referring to FIGS. 9 and 10, in the sensing electrode 210, the first and second sensing electrodes 230 and 240 may be provided on the same plane. In other words, the first and second sensing electrodes 230 and 240 may be provided on the same electrode member 130.

Second sensing electrodes 240 extend in one direction, and may be connected to each other through a bridge electrode 260.

An insulating layer 350 may be provided on the bridge electrode 260. In detail, an insulating layer 350 may be partially provided on the bridge electrode 260. For example, when the bridge electrode 260 is provided in a bar shape, the insulating layer 350 may be provided on areas other than both opposite ends of the bridge electrode 260.

A connection part 250 may be provided on the insulating layer 350 to connect the first sensing electrodes 230 to each other.

The first and second sensing electrodes 230 and 240 are provided on the same plane, so that the thickness of the touch window can be reduced, and the visibility can be improved. In addition, the visibility can be improved as compared with when the first and second sensing electrodes 230 and 240 are provided on different substrates, respectively. In other words, when the first and second sensing electrodes 230 and 240 are provided on different substrates, respectively, the thickness of the touch window can be increased. In addition, when viewed from the top, the conductive pattern of the first sensing electrode 230 is viewed as overlapped with the conductive pattern of the second sensing electrode 240, which may cause a Moire phenomenon. However, according to the embodiment, the first and second sensing electrodes 230 and 240 are provided on one plane to prevent the Moire phenomenon.

Figure 11:
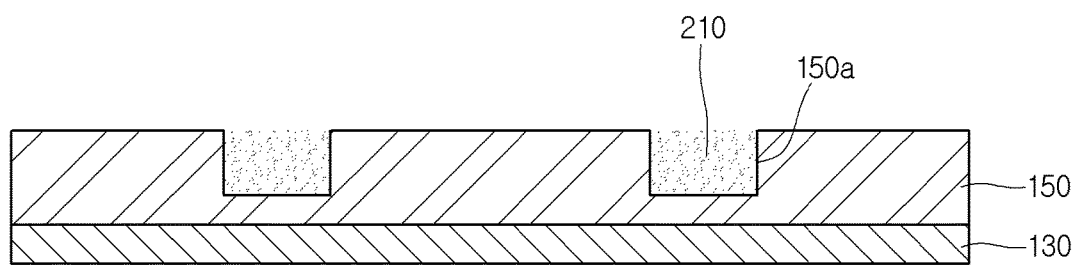

Referring to FIG. 11, a resin layer 150 is provided on an electrode member 130. The resin layer 150 may include an intaglio part 150a. The sensing electrode 210 may be provided in the intaglio part 150a. In other words, the sensing electrode 210 may be formed by filling conductive paste in the intaglio part 150a. Accordingly, when comparing with deposition and photolithography processes according to the related art, the number of processes, the process time, and the process cost can be reduced.

The intaglio part 150a has the H-shaped conductive pattern described above therein, so that the sensing electrode 210 filled in the intaglio part 150a may have the conductive pattern.

Meanwhile, the conductive paste may include a binder and conductive particles dispersed in the binder. The binder may include an organic binder. The binder may have the content of 5% by weight to 15% by weight based on the whole weight of the sensing electrode 210. If the binder has the content of 5% by weight or more based on the whole weight of the sensing electrode 210, the adhesive strength between the sensing electrode 210 and the resin layer 150 can be improved. In addition, if the binder has the content of 15% by weight or less based on the whole weight of the sensing electrode 210, the electrode material may have proper viscosity in a printing process.

Meanwhile, the conductive particles are dispersed in the binder. The conductive particles can be uniformly dispersed in the binder, so that the uniformity of the sensing electrode 210 can be improved.

The conductive particles may include Cu, Au, Ag, Al, Ti, Ni or the alloy thereof.

Figure 12:
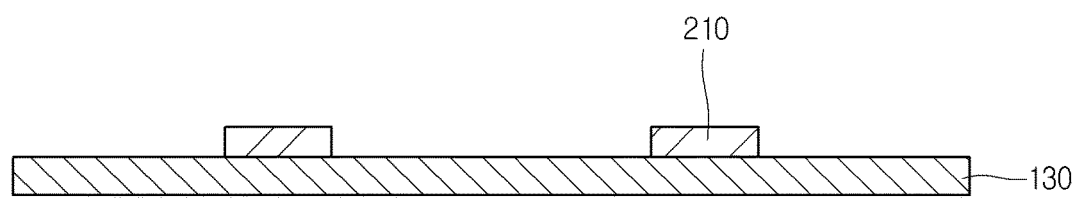

Referring to FIG. 12, a metallic material is deposited on the electrode material 130, so that the sensing electrode 210 having the conductive pattern can be formed. In other words, the metallic material is etched to form the H-shaped conductive pattern descried above. For example, copper (Cu) may be deposited on the electrode member 130, and then the etching process may be performed with respect to the metallic material to form the conductive pattern.

Figure 13:
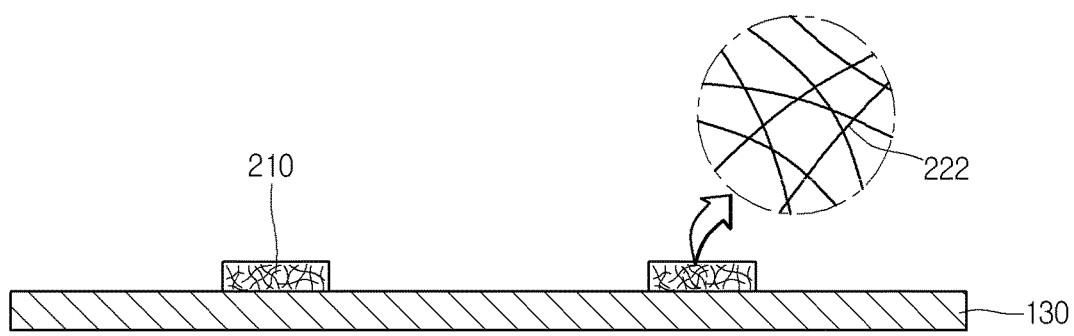

Referring to FIG. 13, the sensing electrode 210 may include an interconnecting structure. The interconnecting structure may be a micro-structure having a diameter of 10 nm to 200 nm. For example, the sensing electrode 210 may include a nanowire. The sensing electrode 210 may include a metallic-nanowire.

Figure 14:
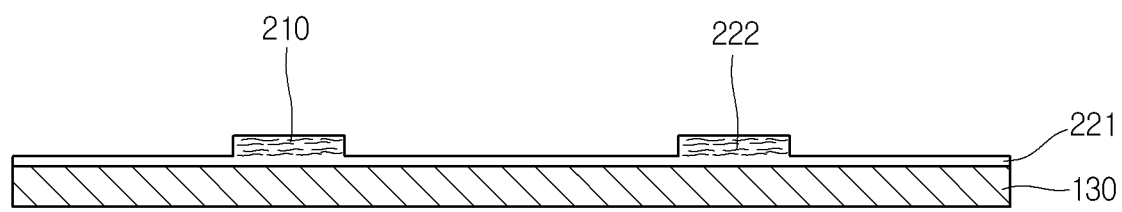

Referring to FIG. 14, the sensing electrode 210 may include a preform 221 and a nanowire 222. The preform 221 includes a sensitive material. The preform 221 includes the sensitive material, so that the electrode part 200 may be formed through exposure and development processes.

The sensing electrode 210 may include a sensitive nanowire film. The sensing electrode 210 includes the sensitive nanowire film, so that the thickness of the sensing electrode 210 can be reduced. In other words, the sensing electrode 210 includes nanowires, and the whole thickness of the sensing electrode 210 can be reduced. Conventionally, when the electrode part includes the nanowires, an overcoating layer must be additionally formed to prevent the nanowires from being oxidized, so that the fabricating process may be complicated, and the thickness of the touch window may be reduced. However, according to the present embodiment, the nanowires are provided in the sensitive material so that the nanowires can be prevented from being oxidized without the overcoating layer.

Figure 15:
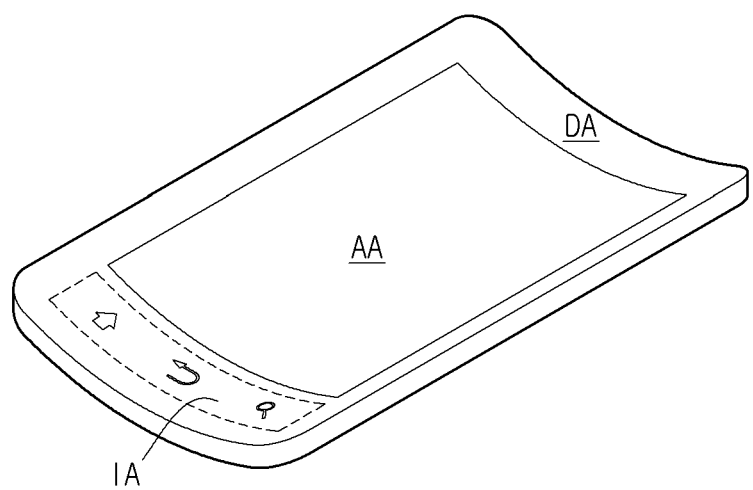
Figure 17:
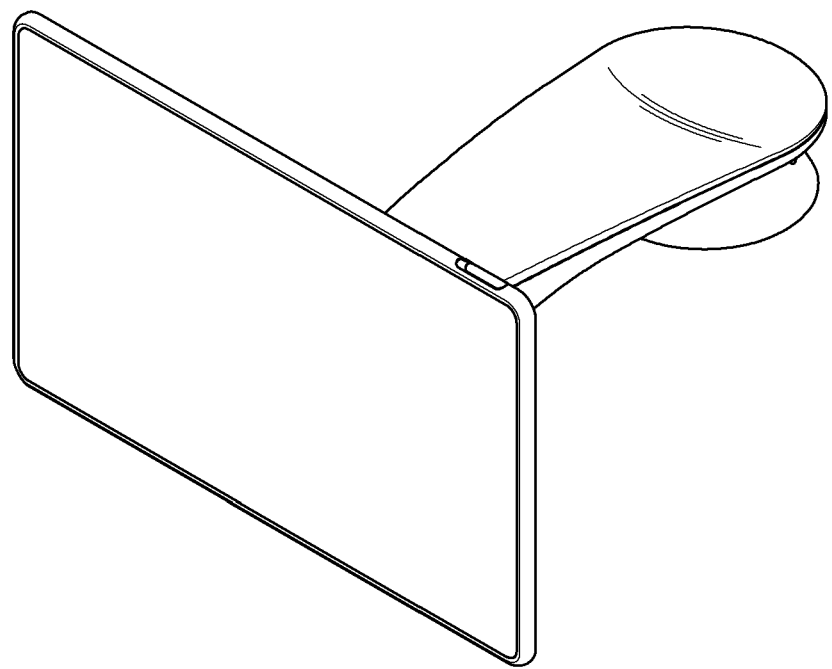

Subsequently, as shown in FIGS. 15 and 17, the touch window may be provided on the display panel serving as the driving part. The touch window may be combined with the display panel to constitute the display. As shown in FIG. 6, the display may include a mobile terminal.

In particular, the touch window may include a curved touch window. Accordingly, the display including the touch window may include a curved display. In addition, the electrode part 200 includes the conductive pattern, so that the bending characteristic of the touch window and the reliability of the touch window can be improved.

The display panel has a display region to output an image. The display panel applied to the display may generally include upper and lower substrates. The lower substrate may include data lines, gate lines, and thin film transistors (TFT). The upper substrate is bonded to the lower substrate to protect components provided on the lower substrate.

The display panels may be provided in various types depending on the type of the display according to the present invention. In other words, the display according to the present invention may include a liquid crystal display (LCD), a field emission display, a plasma display (PDP), an organic light emitting diode (OLED), and an electrophorectic display (EPD). Accordingly, the display panel may be configured in various types.

Figure 16:
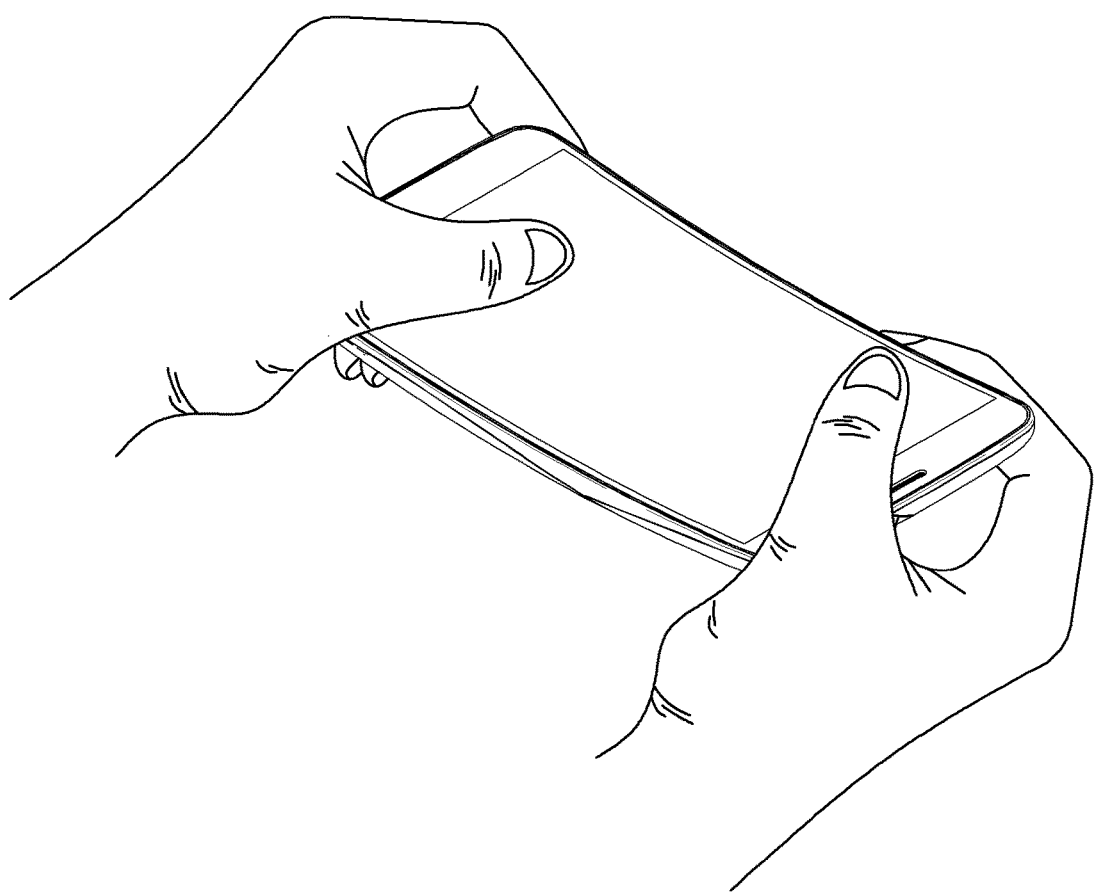

Meanwhile, referring to FIG. 16, the touch window may include a flexible touch window that is bent. Accordingly, the display including the flexible touch window may be a flexible display. Accordingly, a user may bend or curve the flexible touch window with the hand of the user. In addition, the electrode part 200 includes a conductive pattern, so that the bending characteristic and the reliability of the touch window can be improved.

Meanwhile, referring to FIG. 17, the touch window may be applied to a navigation system of a vehicle as well as a mobile terminal. However, the embodiment is not limited to the embodiment. In other words, the display may be used in various electronic products.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A touch window comprising:
   a substrate; and
   an electrode part having a mesh shape on the substrate,
   wherein the electrode part is extended in a predetermined direction,
   wherein a plurality of virtual outlines is defined on the substrate,
   wherein a shape of the electrode part is formed by the virtual outlines,
   wherein the electrode part comprises a plurality of electrode patterns,
   wherein each electrode pattern comprises first electrode parts, second electrode parts, third electrode parts, and fourth electrode parts provided in an inner area of the virtual outline,
   wherein the first electrode parts comprise a first mesh line extended in a first direction,
   wherein the second electrode parts comprise a second mesh line extended in a second direction crossing the first direction,
   wherein the third electrode parts comprise a plurality of third mesh lines extended in a third direction crossing the first direction and the second direction,
   wherein the fourth electrode parts comprise a fourth mesh line extended in a fourth direction crossing the first direction, the second direction, and the third direction,
   wherein a first end of a first third mesh line is connected with a first end of the first mesh line, and a second end of the first third mesh line is connected with a first end of the second mesh line,
   wherein a second end of the first mesh line is connected with a first end of a second third mesh line,
   wherein a second end of the second mesh line is connected with a first end of a third third mesh line,
   wherein the fourth mesh line is provided between the first third mesh line and a fourth third mesh line different from the first third mesh line, the second third mesh line, and the third third mesh line,
   wherein a first end of the fourth mesh line is connected with the first third mesh line and a second end of the fourth mesh line is connected with the fourth third mesh line,
   wherein the predetermined direction of the electrode part makes an acute angle with the first direction, the second direction, the third direction, and the fourth direction,
   wherein the electrode part comprises:
      a resin layer;
      a plurality of first sub-patterns on the resin layer; and
      a plurality of second sub-patterns on the resin layer,
   wherein the second sub-patterns have a line width narrower than a line width of the first sub-patterns,
   wherein the first sub-patterns and the second sub-patterns are disposed on the same surface of the resin layer,
   wherein the first sub-patterns and the second sub-patterns are in direct physical contact with the resin layer,
   wherein the first sub-patterns and the second sub-patterns are formed integrally,
   wherein a first sub-pattern of the plurality of first sub-patterns is disposed between the second sub-patterns,
   wherein an electrode layer is disposed on the first sub-patterns, and
   wherein a length of the second sub-patterns having both ends making contact with the first and second electrode parts is longer than a length of the third electrode parts adjacent to the second sub-patterns.

2. The touch window of claim 1, wherein each electrode pattern comprises a conductive pattern.

3. The touch window of claim 1, wherein each electrode pattern has an H-shaped pattern.

4. The touch window of claim 1, further comprising a dummy part adjacent to each electrode pattern.

5. The touch panel of claim 1, wherein the first mesh line is physically separated from the second mesh line.

6. A display comprising:
   a touch window; and
   a driving part on the touch window,
   wherein the touch window comprises:
   a substrate; and
   an electrode part having a mesh shape on the substrate,
   wherein the electrode part is extended in a predetermined direction,
   wherein a plurality of virtual outlines is defined on the substrate,
   wherein a shape of the electrode part is formed by the virtual outlines,
   wherein the electrode part comprises a plurality of electrode patterns,
   wherein each electrode pattern comprises first electrode parts, second electrode parts, third electrode parts, and fourth electrode parts,
   wherein the first electrode parts comprise a first mesh line extended in a first direction,
   wherein the second electrode parts comprise a second mesh line extended in a second direction crossing the first direction,
   wherein the third electrode parts comprise a third mesh line extended in a third direction crossing the first direction and the second direction,
   wherein the fourth electrode parts comprise a fourth mesh line extended in a fourth direction crossing the first direction, the second direction, and the third direction,
   wherein the first to fourth mesh lines are disposed within the virtual outlines,
   wherein a first end of a first third mesh line is connected with a first end of the first mesh line, and a second end of the first third mesh line is connected with a first end of the second mesh line,
   wherein a second end of the first mesh line is connected with a first end of a second third mesh line,
   wherein a second end of the second mesh line is connected with a first end of a third mesh line,
   wherein the fourth mesh line is provided between the first third mesh line and a fourth third mesh line different from the first third mesh line, the second third mesh line, and the third third mesh line,
   wherein a first end of the fourth mesh line is connected with the first third mesh line, and a second end of the fourth mesh line is connected with the fourth third mesh line,
   wherein the predetermined direction of the electrode part makes an acute angle with the first direction, the second direction, the third direction, and the fourth direction,
   wherein the electrode pan comprises:
      a resin layer;
      a plurality of first sub-patterns on the resin layer; and
      a plurality of second sub-patterns on the resin layer,
   wherein the second sub-patterns have a line width narrower than a line width of the first sub-patterns,
   wherein the first sub-patterns and the second sub-patterns are disposed on the same surface of the resin layer,
   wherein the first sub-patterns and the second sub-patterns are in direct physical contact with the resin layer, wherein the first sub-patterns and the second sub-patterns are formed integrally, wherein a first sub-pattern of the plurality of first sub-patterns is disposed between the second sub-patterns, wherein an electrode layer is disposed on the first sub-patterns, and wherein a length of the second sub-patterns having both ends making contact with the first and second electrode parts is longer than a length of the third electrode parts adjacent to the second sub-patterns.

7. The display of claim 6, wherein the touch window comprises a curved touch window or a flexible touch window.

8. The display of claim 6, wherein the first mesh line is physically separated from the second mesh line.

* * * * *